United States Patent
Takaki et al.

(10) Patent No.: US 6,221,520 B1
(45) Date of Patent: Apr. 24, 2001

(54) TRANSPARENT CONDUCTIVE FILM AND PROCESS FOR FORMING A TRANSPARENT ELECTRODE

(75) Inventors: Satoru Takaki; Kazuo Sato; Masami Miyazaki; Yuki Kawamura; Hiromichi Nishimura, all of Yokohama (JP)

(73) Assignee: Asahi Glass Company Ltd., Tokyo (JP)

( * ) Notice: Subject to any disclaimer, the term of this patent is extended or adjusted under 35 U.S.C. 154(b) by 0 days.

(21) Appl. No.: 09/237,368

(22) Filed: Jan. 26, 1999

Related U.S. Application Data

(63) Continuation-in-part of application No. PCT/JP97/02545, filed on Jul. 23, 1997.

(30) Foreign Application Priority Data

Jul. 26, 1996 (JP) .................................... 8-198041

(51) Int. Cl.[7] .............................. B32B 9/00; B32B 19/00
(52) U.S. Cl. ..................... 428/699; 428/697; 428/699; 428/701; 428/702; 359/360; 359/361; 359/580; 359/582; 359/585; 427/126.5; 427/126.3
(58) Field of Search ..................................... 428/697, 699, 428/701, 702; 359/360, 361, 580, 582, 585; 427/126.5, 126.3

(56) References Cited

U.S. PATENT DOCUMENTS

| | | |
|---|---|---|
| 5,510,173 | 4/1996 | Pass et al. . |
| 5,780,149 * | 7/1998 | McCurdy et al. .................. 428/334 |

FOREIGN PATENT DOCUMENTS

| | | |
|---|---|---|
| 0 707 320 | 4/1996 | (EP) . |
| 6-187832 | 7/1994 | (JP) . |
| 6-234522 | 8/1994 | (JP) . |
| 6-290641 | 10/1994 | (JP) . |
| 7-120612 | 5/1995 | (JP) . |
| 7-235219 | 9/1995 | (JP) . |
| 7-325313 | 12/1995 | (JP) . |
| 7-335046 | 12/1995 | (JP) . |
| 408062633 * | 3/1996 | (JP) .............................. G02F/01/136 |
| 8-264021 | 10/1996 | (JP) . |

* cited by examiner

Primary Examiner—Deborah Jones
Assistant Examiner—Lymarie Miranda
(74) Attorney, Agent, or Firm—Oblon, Spivak, McClelland, Maier & Neustadt, P.C.

(57) ABSTRACT

A transparent conductive film having a transparent oxide layer and a metal layer containing Ag, laminated in this order from a substrate side in a total of (2n+1) layers), wherein n is an integer of at least 1, wherein the transparent oxide layer contains ZnO and further contains In within a range of from 9 to 98 atomic % based on the sum of Zn and In, and a process for forming a transparent electrode.

26 Claims, 9 Drawing Sheets

(a)

(b)

(a)

(b)

(a)

(b)

(c)

(d)

(a)

Proportion
of Ag      : 0           50            100%    (atomic %)
Proportion  100          50              0 %   (atomic %)
of other
metal(s)

(b)

(a)

(b)

F I G . 7
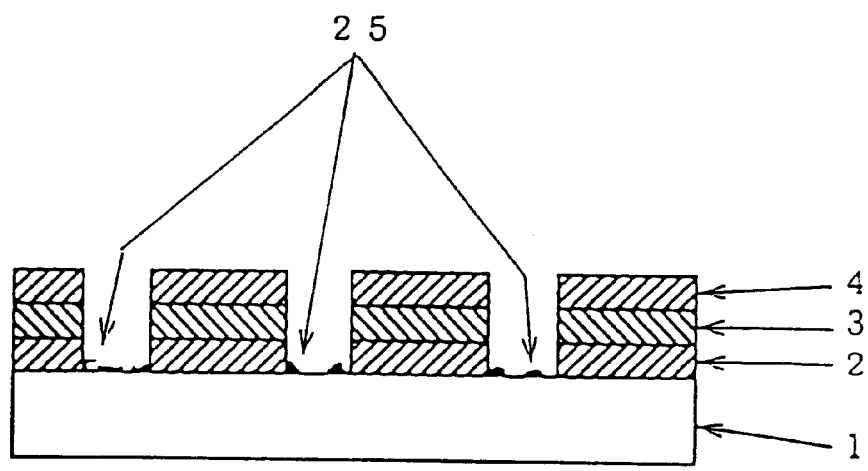

(a)

(b)

(c)

(a)

(b)

TRANSPARENT CONDUCTIVE FILM AND PROCESS FOR FORMING A TRANSPARENT ELECTRODE

This application is a continuation-in-part (CIP) application of PCT/JP97/02545, filed Jul. 23, 1997.

BACKGROUND OF THE INVENTION

1. Field of the Invention

The present invention relates to a transparent conductive film useful for e.g. a liquid crystal display (LCD) and a process for forming a transparent electrode.

2. Discussion of the Background

At present, a film made of a mixed oxide of In and Sn (hereinafter referred to as $InSn_xO_y$) is widely employed as an electrode for LCD. Particularly in a STN type color LCD, along with the progress for high resolution and a large image screen, the transparent electrode for driving liquid crystal is required to have a narrower line width and a longer shape.

Accordingly, a transparent conductive film having an extremely low resistance with a sheet resistance of not higher than $3\Omega/\square$ is required. To accomplish such a sheet resistance, it is necessary to increase the film thickness (at least 300 nm) of the transparent conductive film or to reduce the resistivity (not higher than 100 $\mu\Omega\cdot$cm).

However, there is a limit -in increasing the film thickness, since 1) the film forming cost for the transparent conductive film increases, 2) difficulty in patterning the electrode increases, and 3) a step difference increases as between the presence and the absence of the transparent electrode, whereby there will be a problem that control of the alignment of liquid crystal molecules will be difficult.

On the other hand, a method of reducing the resistivity of the $InSn_xO_y$ film itself has been studied, but a method for constantly producing an $InSn_xO_y$ film having a low resistance of not higher than 100 $\mu\Omega\cdot$cm, has not yet been established.

On the other hand, as a method for readily obtaining transparent conductive film having a low resistance of not higher than 100 $\mu\Omega\cdot$cm, it is known to sandwich a Ag layer between $InSn_xO_y$ layers to have a structure of $InSn_xO_y$/Ag/$InSn_xO_y$. Such a structure provides a low resistivity, but the durability is so poor that when left to stand in a room, white defects will form which appear to be peeling off the film. Further, also at the time of processing the electrode pattern by etching by means of an acidic aqueous solution, side etching tends to proceed, whereby peeling is observed at a pattern edge portion, and thus the processability is inadequate.

Accordingly, a substrate having a structure of $InSn_xO_y$/Ag/$InSn_xO_y$ has not yet been practically used as a transparent conductive substrate for LCD, even though it has the advantage that low resistance can easily be attained.

SUMMARY OF THE INVENTION

It is an object of the present invention to provide a transparent conductive film which is useful for LCD and which has low resistivity and has excellent durability and microelectrode processability, and a process for forming a transparent electrode.

The present invention provides a transparent conductive film having a transparent oxide layer and a metal layer laminated in this order from a substrate side in a total of (2n+1) layers, wherein n is an integer of at least 1, wherein the transparent oxide layer contains ZnO and further contains In within a range of from 9 to 98 atomic % based on the sum of Zn and In, and wherein the metal layer is a metal layer containing Ag.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7 is a diagrammatical view illustrating formation of etching residues.

DESCRIPTION OF PREFERRED EMBODIMENTS

Figure 1:
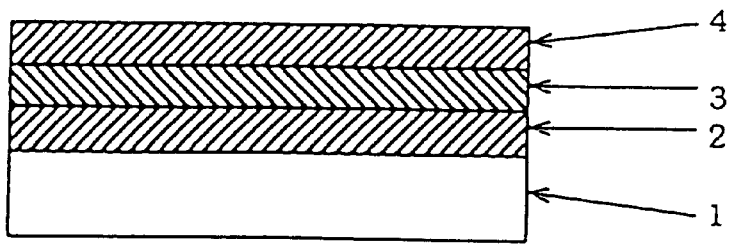
FIG. 1(a) is a cross-sectional diagrammatical view of an embodiment of a three layer film type transparent conductive film of the present invention.
FIG. 1(b) is a cross-sectional diagrammatical view of an embodiment of a five layer film type transparent conductive film of the present invention.
Figure 1:
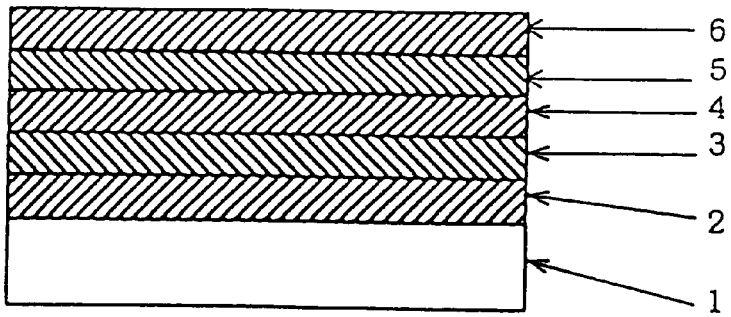

Referring now to the drawings, wherein like reference numerals designate identical or corresponding parts throughout the several views.

FIG. 1(a) shows a cross-sectional view of the transparent conductive film of the present invention in a case where n=1, and FIG. 1(b) shows a similar cross-sectional view in a case where n=2. Reference numeral 1 indicates a substrate, numerals 2, 4 and 6 transparent oxide layers, and numerals 3 and 5 metal layers containing Ag.

The transparent oxide layers 2, 4 and 6 are oxide layers which contain ZnO and which further contain In within a range of from 9 to 98 atomic % based on the sum of Zn and In. The content of In is particularly preferably from 45 to 95 atomic %. The thickness of the transparent oxide layer 6 is preferably from 10 to 200 nm, more preferably from 20 to 50 nm, most preferably from 35 to 50 nm.

In the present invention, the transparent oxide layers contain ZnO, and accordingly, as compared with a conventional case where an $InSn_xO_y$ film is used, even under a low temperature film-forming condition of at most 150° C., crystallization of Ag is promoted, and it is not only possible to accomplish reduction of the resistance and prevention of a coalescence phenomenon of Ag of the metal layer containing Ag (hereinafter referred to as a Ag layer), but also possible to improve the adhesive strength between the Ag layer and the oxide layer containing ZnO, whereby the moisture resistance and the processability of a microelectrode pattern with an acidic aqueous solution (hereinafter referred to as a patterning property) can be remarkably improved.

Here, it is preferred to have a construction such that a Ag layer and a layer rich in the ZnO component will be in contact with each other. Especially, in the oxide layer which is in contact with the Ag layer, the portion which is in contact with the Ag layer preferably contains Zn in an amount of at least 50 atomic % based on the sum of Zn and In. In such a case, Zn may be 100 atomic %, i.e. the portion which is in contact with the Ag layer may be ZnO containing no In. The thickness of the ZnO rich portion which is in contact with the Ag layer is preferably at least 1 nm, more preferably at least 5 nm.

Further, the oxide layers contain In within a range of from 9 to 98 atomic % based on the sum of Zn and In, whereby in addition to the above-mentioned excellent characteristics which ZnO has, the durability against an alkali solution or an acidic solution will be improved.

In the present invention, as the substrate 1, a glass sheet or a resin film may, for example, be used. Further, a substrate as shown in FIG. 2 may also be used. In FIG. 2, a substrate for color LCD is shown which corresponds to the substrate 1 in FIG. 1. Reference numeral 39 indicates a glass substrate, numeral 7 a color filter layer constituting color pixels (red, green and blue pixels), numeral 8 a transparent resin protective layer, and numeral 9 an inorganic interlayer.

The transparent resin protective layer 8 protects and flattens the color filter layer. The inorganic interlayer 9 serves to improve the adhesion between the transparent resin protective layer 8 and the transparent conductive film, and silica or $SiN_x$ may, for example, be employed.

Figure 3:
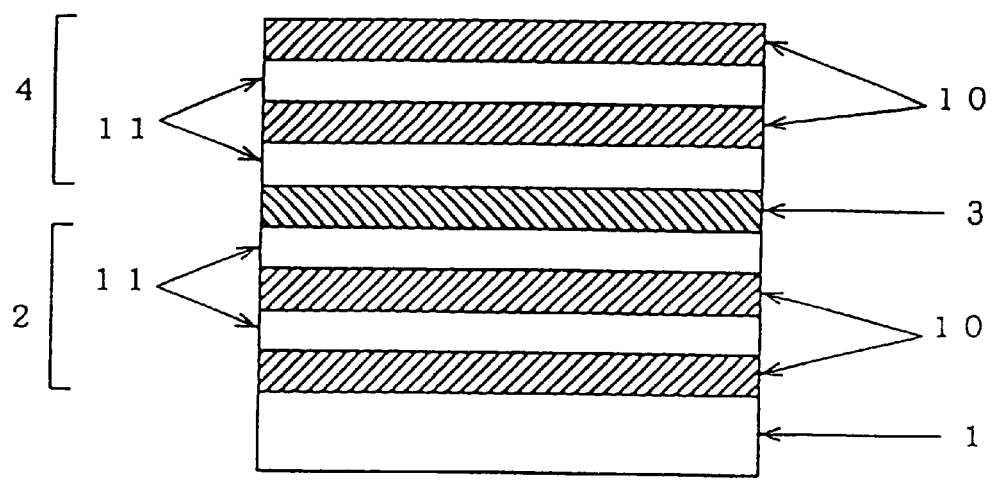
FIG. 3 is a cross-sectional diagrammatical view of a transparent conductive film of the present-invention wherein an oxide layer has a multi-layer structure.

At least one of the transparent oxide layers is 1) a layer comprising a mixed oxide of $In_2O_3$ and ZnO, or 2) a layer made of a multi-layer film comprising films containing $In_2O_3$ as the main component and films 11 containing ZnO as the main component, as shown in FIG. 3. For the practical purpose, all of the transparent oxide layers should preferably be unified with either type 1) or 2).

In a case where a transparent oxide layer is a layer made of a multi-layer film, it is preferred that the entire thickness of the transparent oxide layer 2 is from 10 to 200 nm, and the ratio of the total thickness of films 10 containing $In_2O_3$ as the main component is from 5 to 95% to the entire thickness. The same applies to the transparent oxide layer 4 or 6. With such a construction, the alkali resistance can be improved without impairing the moisture resistance or the patterning property. Particularly preferably, said ratio is from 45 to 95%. In this specification, "thickness" means a geometrical thickness.

The transparent oxide layer 6 farthest from the substrate is preferably a) a layer which is made of a multi-layer film comprising films containing $In_2O_3$ as the main component and films containing ZnO as the main component, as shown in FIG. 4(a), wherein the multilayer film has films laminated so that their In contents (the proportions of In based on the sum of Zn and In) increase as they are located farther from the substrate, or b) a layer of a mixed oxide of $In_2O_3$ and ZnO as shown in FIG. 4(b), which has a compositional gradient so that the In content increases in the layer thickness direction in the direction away from the substrate. FIG. 4(b) shows the state in which the in content in the transparent oxide layer 6 increases in the direction away from the substrate.

Figure 4:
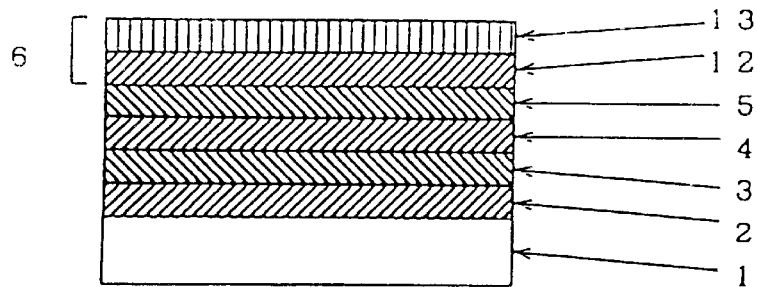
FIG. 4(a) is a cross-sectional diagrammatical view of an embodiment of a transparent conductive film of the present invention wherein the uppermost transparent oxide layer is a layer made of a multi-layer film comprising film(s) containing $In_2O_3$ as the main component and film(s) containing ZnO as the main component, and said multi-layer film has layers laminated so that their $In_2O_3$ contents increase as they are located farther from the substrate.
FIG. 4(b) is a cross-sectional diagrammatical view of an embodiment of a transparent conductive film of the present invention, wherein the uppermost transparent oxide layer is a layer of a mixed oxide of $In_2O_3$ and ZnO, which has a compositional gradient so that the $In_2O_3$ content increases in the layer thickness direction in the direction away from the substrate.
FIG. 4(c) is a cross-sectional diagrammatical view of an embodiment of a transparent conductive film of the present invention, wherein the transparent oxide layer nearest to the substrate is a layer made of a multi-layer film comprising film(s) containing $In_2O_3$ as the main component and film(s) containing ZnO as the main component, and said multi-layer film has films laminated so that their $In_2O_3$ contents increase as they are located nearer to the substrate.
FIG. 4(d) is a cross-sectional diagrammatical view of an embodiment of a transparent conductive film of the present invention, wherein the transparent oxide layer nearest to the substrate is a layer of a mixed oxide of $In_2O_3$ and ZnO, which has a compositional gradient so that the $In_2O_3$ content increases in the layer thickness direction in the direction towards the substrate.
Figure 4:
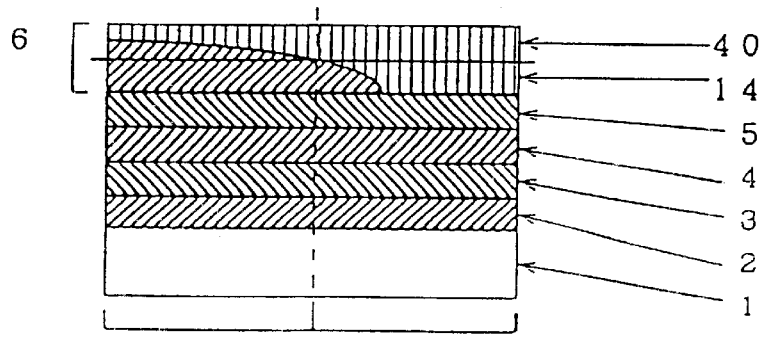
Figure 4:
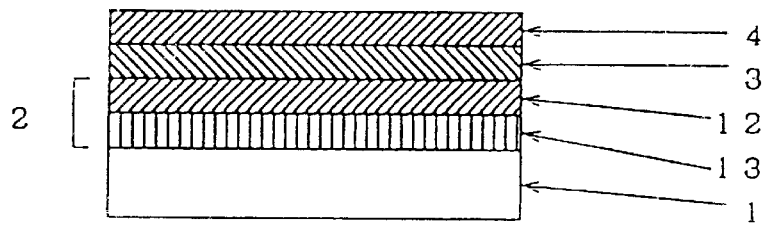
Figure 4:
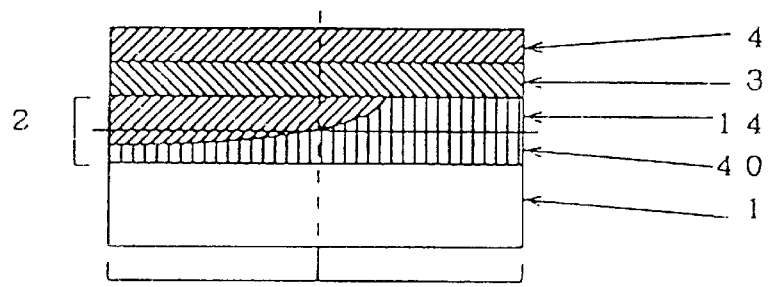

In FIG. 4, reference numeral 12 indicates a film having an In content smaller than the oxide film 13, numeral 13 a film having an In content larger than the oxide film 12, numeral 14 a portion where the In content is less than 50 atomic %, and numeral 40 a portion where the In content is at least 50 atomic %.

With the construction of a) or b), the corrosion resistance against an alkali solution or an acidic solution will be excellent.

As a preparation example for the case a), a film containing ZnO as the main component and a film containing $In_2O_3$ as the main component may be laminated in this order from the substrate side so as to increase the ratio of the thickness of the film containing $In_2O_3$ as the main component to the thickness of the film containing ZnO as the main component in the direction farther from the substrate and to have the uppermost layer made of a film containing $In_2O_3$ as the main component.

As a preparation example for the case b), a target containing ZnO as the main component and a target containing $In_2O_3$ as the main component may simultaneously be subjected to sputtering, whereby the sputtering electric powers to the respective targets may be changed so that the compositional ratio of $In_2O_3$ increases in the direction away from substrate. Otherwise, several mixed oxide targets differing in the compositional ratios of ZnO and $In_2O_3$ are sequentially subjected to sputtering in such an order that the compositional ratio of $In_2O_3$ increases in the direction away from the substrate.

Further, the transparent oxide layer 2 nearest to the substrate is preferably c) a layer made of a multilayer film comprising films containing $In_2O_3$ as the main component and films containing ZnO as the main component, as shown in FIG. 4 (c), wherein the multi-layer film has films laminated so that their In contents increase as they are located nearer to the substrate, or d) a layer of a mixed oxide of $In_2O_3$ and ZnO as shown in FIG. 4(d), which has a compositional gradient so that the In content increases in the layer thickness direction in the direction towards the substrate.

Here, FIG. 4(d) shows a state in which the In content in the transparent oxide layer increases in the direction towards the substrate.

With the construction of c) or d), the adhesive strength with a substrate in contact with an alkali solution or an acidic solution will be remarkably improved.

In the constructions of a) to d), the thickness of each transparent oxide layer is preferably from 10 to 200 nm from the viewpoint of the color tone and the visible light transmittance. Further, in the constructions of a) to d), the octal thickness of portions where the thickness ratio of the film A containing $In_2O_3$ as the main component on the film B containing ZnO as the main component, to the thickness of the film containing ZnO as the main component, i.e. the thickness of film A/the thickness of film B, is at least 1 (e.g. a total thickness of c) to f) when the uppermost oxide layer 6 comprises, from the substrate side, a) ZnO (7 nm)/b) $In_2O_3$ (3 nm)/ c) ZnO (5 mm)/d) $In_2O_3$ (5 nm)/e) ZnO (3 nm)/f) $In_2O_3$ (20 nm)), or the thickness of the portion where the In content exceeds 50 atomic %, is preferably from 5 to 50 nm from the viewpoint of the patterning property and the alkali resistance. If it is less than 5 nm, the alkali resistance will not be good, and if it exceeds 50 nm, the patterning property tends to deteriorate. Especially in the construction of a) or b), it is preferred from the viewpoint of the alkali resistance and the patterning property that the In content in the lower layer portion 12 or 14 of the transparent oxide layer 6 farthest from the substrate is from 50 to 90 atomic % and the In content in the upper layer portion 13 or 40 is at least 90 atomic % based on the sum of In and Zn, and the thickness of the upper portion 13 or 40 is from 5 to 50 nm (particularly from 5 to 20 nm). For the upper layer portion 13, $In_2O_3$ may preferably be employed. Further, such $In_2O_3$ may contain Sn, and Sn is preferably from 1 to 19 atomic %, particularly preferably from 3 to 15 atomic %, based on the sum of In and Sn.

In the present invention, when a film containing Zn as the main component is to be formed, such a film preferably contains Ga. Specifically, ZnO containing Ga is preferred. ZnO which is an electrical insulator, shows electrical conductivity when a trivalent dopant such as Al is added thereto, and one in which Ga is added, exhibits the best electrical conductivity and visible light transmittance.

Further, when direct current sputtering with high productivity is to be used as a film forming method for ZnO, Zn metal may also be used as a target, but there is a drawback that the margin of the film-forming conditions is narrow. By the addition of Ga to Zn, direct current sputtering from a ZnO target can be adopted, and the margin of the film-forming conditions will be very wide.

The proportion of Ga is preferably from 1 to 15 atomic % based on the sum of Zn and Ga. If it is less than 1 atomic %, the film-forming rate tends to be low, and if the doped amount exceeds 15 atomic %, the visible light transmittance tends to be low.

In the present invention, at least one of the metal layers is preferably 1) a layer made of an alloy film comprising Ag and other metal(s), 2) a layer of a multilayer structure comprising a Ag layer and other metal layer(s), or 3) a layer which comprises Ag and other metal(s) and which has a compositional gradient so that the Ag concentration changes in the thickness direction of the layer.

In the case of the above 2), it is preferred, for example, to have a construction such that said other metal layer(s) are present at interfaces with the transparent oxide layers. In such a case, a plurality of interfaces are present, and said other metal layer is provided to be present at least at one of the interfaces.

As mentioned above, the metal layer is made to be 1) an alloy layer, 2) a layer of a multi-layer structure or 3) a layer with compositional gradient, whereby deterioration in the moisture resistance due to an coalescence phenomenon of Ag can be overcome without impairing the low resistance and the high visible light transmittance.

Figure 5:
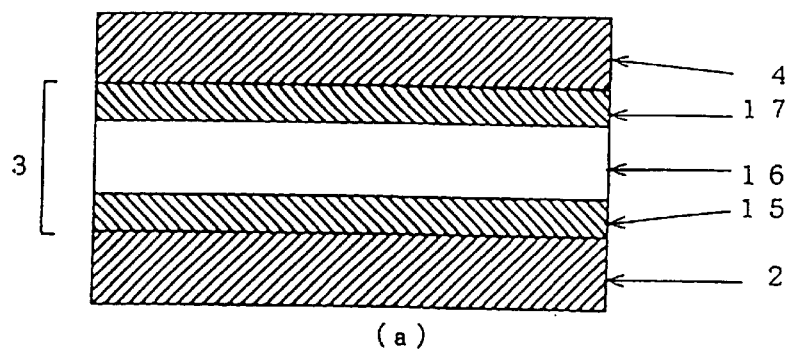
FIG. 5(a) is a cross-sectional diagrammatical view of an embodiment of a transparent conductive film of the present invention, wherein other metal(s) other than Ag are present at the interface between the metal layer containing Ag and the oxide layer.
FIG. 5(b) is a cross-sectional diagrammatical view of an embodiment of a transparent conductive film-of the present invention, wherein a metal film having a compositional gradient and having a high compositional ratio of metal(s) other than Ag at the interface between the metal layer containing Ag and the oxide layer.
Figure 5:
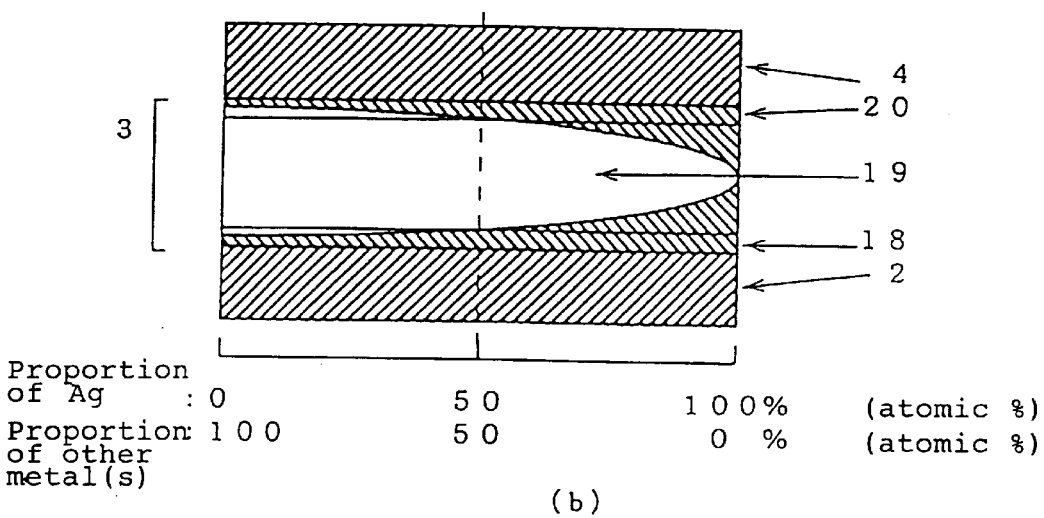
Figure 6:
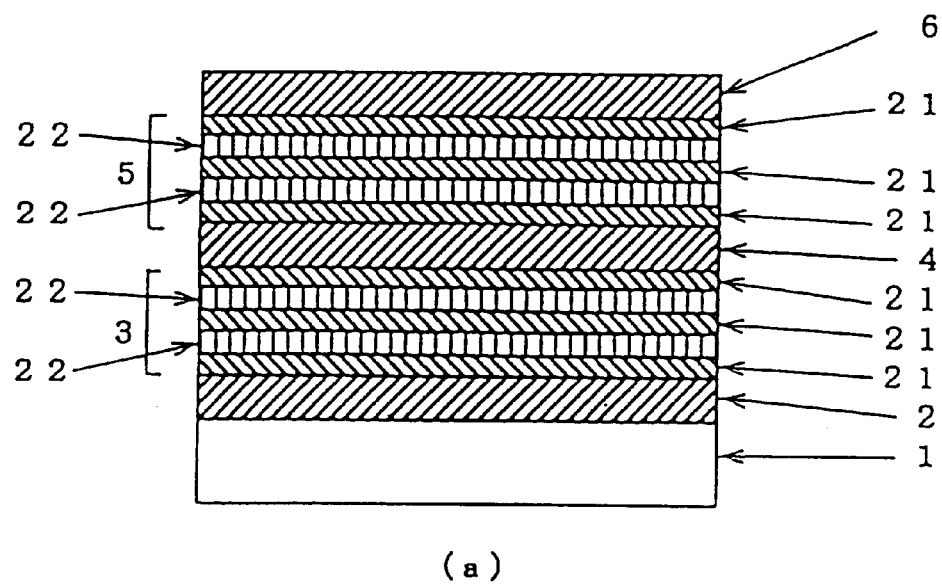
FIG. 6(a) is a cross-sectional diagrammatical view of an embodiment of a transparent conductive film of the present invention, wherein the metal layers have a multilayer structure.
FIG. 6(b) is a cross-sectional diagrammatical view of an embodiment of the transparent conductive film of the present invention, wherein the metal layer is a metal layer having a compositional gradient of Ag and metal(s) other than Ag.
Figure 6:
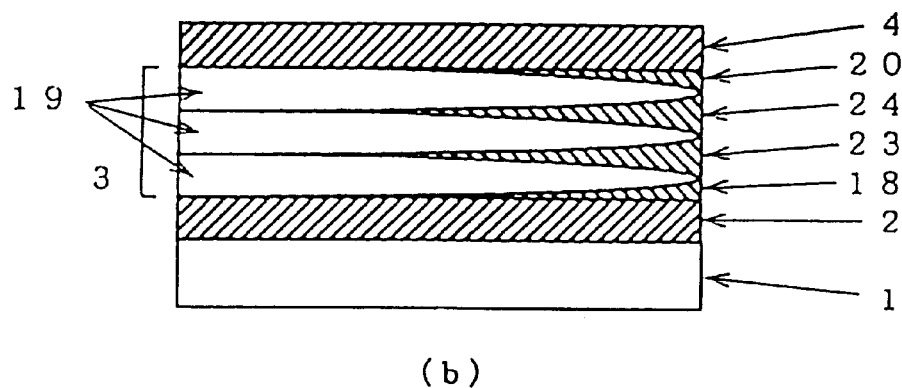

In any one of the above cases 1) to 3), the thickness of the metal layer (corresponding to 3 or 5 in FIGS. 5 and 6) is preferably from 3 to 20 nm. If it is less than 3 nm, the sheet resistance tends to be high, and if it exceeds 20 nm, the visible light transmittance 20 tends to be low. The thickness is more preferably from 8 to 20 nm, most preferably from 10 to 15 nm.

Said other metal(s) may preferably be at least one metal selected from the group consisting of Pd, Au, Cu, Zn, Sn, Ti, Zr, V, Ni, Cr, Pt, Rh, Ir, W, Mo and Al, for the reason that reduction of the resistance, improvement of the transmittance and improvement of the durability can be satisfied. Particularly preferably, said other metal(s) are Au and/or Pd. By the addition of Au or Pd, it is possible to prevent the coalescence phenomenon of Ag and thereby to obtain a Ag film having high durability.

Taking Pd as an example for said other metal, the constructions of the metal layers of the above 1) to 3) will be specifically described.

For the construction of the above 1), a layer made of an alloy film comprising Ag and Pd (which may be referred to as a PdAg alloy layer) is employed. In the PdAg alloy layer, Pd is uniformly present in Ag. In such a case, the proportion of Pd in the PdAg alloy layer is preferably from 0.1 to 5.0 atomic % based on the sum of Ag and Pd. If it is less than 0.1 atomic %, the durability tends to be inadequate, and if it exceeds 5.0 atomic %, the visible light transmittance tends to be low, and the resistance tends to increase.

In the construction of the above 2), Pd layers (interlayers) 15 and 17 are present at the interfaces between the transparent oxide layers 2 and 4 and the Ag layer 16, as shown in FIG. 5(a). In such a case, the range of the thickness of the interlayer 15 or 17 is preferably from 0.1 to 3 nm. By the presence in this thickness, the same effects as the effects of adding Pd in the above-mentioned 1), can be obtained. If the thickness of the interlayer is less than 0.1 nm, the durability tends to be inadequate, and if it exceeds 3 nm, the visible light transmittance tends to be low. Particularly preferably, the thickness is from 0.1 to 1 nm.

Further, as the construction of the above 2), a multi-layer structure comprising a Ag layer 22 and a Pd layer 21, may be adopted as shown in FIG. 6(a). In such a case, it is preferred that the thickness of each Pd layer 21 is made to be from 0.1 to 3 nm, and the thickness of each Ag layer is made to be from 1 to 20 nm.

For the construction of the above 3), a layer having a compositional gradient so that the Ag concentration changes in the thickness direction of the layer, is employed as shown in FIG. 5(b) or in FIG. 6(b). In such a case, it is possible to adopt a construction wherein Pd-rich layers 18 and 20 are present which increase the Pd concentration, or a multi-layer construction comprising Ag-rich layers 19 and Pd-rich layers 18, 20, 23 and 24, as shown in FIG. 6(b). The Pd-rich layers 18, 20, 23 and 24 are layers wherein Pd is at least 50 atomic % based on the sum of Ag and Pd, as shown in FIG. 5(b).

The thickness of the Pd-rich layer is preferably from 0.1 to 3 nm, since if it is less than 0.1 nm, the durability tends to be inadequate, and if it exceeds 3 nm, the visible light transmittance tends to be low.

By selecting the thicknesses of the respective layers constituting the transparent conductive film within the above described ranges, it is possible to adjust the transmittance due to the optical interference effects, to adjust the color tone and to adjust the sheet resistance.

Specific examples for the construction of a transparent conductive film of the present invention wherein (2n+1) layers (wherein n is an integer of at least 1) are laminated, may be a) substrate/transparent oxide layer (from 5 to 30 nm, particularly preferably from 10 to 20 nm)/metal layer (from 5 to 20 nm)/transparent oxide layer (from 30 to 50 nm), and b) transparent oxide layer (from 30 to 50 nm, particularly preferably from 35 to 45 nm)/metal layer (from 5 to 20 nm)/transparent oxide layer (from 80 to 120 nm, particularly preferably from 90 to 110 nm)/metal layer (from 5 to 20 nm)/transparent oxide layer (from 30 to 50 nm).

The transparent conductive film of the present invention shows a low sheet resistance, a high visible light transmittance and high durability. However, in order to further improve the properties, heat treatment at from 100 to 300° C. may be applied after the film formation.

By such heat treatment, crystallization and stabilization of the oxide layers and the Ag layers may be promoted, whereby a lower resistance and a higher visible light transmittance can be obtained, and the heat resistance will also be improved.

The transparent conductive film of the present invention is most suitable as a transparent electrode film for an electron display which requires low resistance, such as LCD, an electroluminescence display, a plasma display or an electrochromic element, since a low resistance at a level of not more than 3Ω/□ can readily be obtained. Especially in a simple matrix type LCD, use of the transparent conductive film of the present invention provides excellent effects for improvement of the display quality such as reduction of cross talk or for enlarging the display area.

The present invention provides also a process for forming a transparent electrode, which comprises forming the above-mentioned transparent conductive film on a substrate, followed by patterning by etching by means of an acidic aqueous solution having a hydrogen ion concentration of from 0.01 to 9 M. By using the process for forming a transparent electrode of the present invention, patterning with a side etching amount of not more than 5 μm is made possible, and the formed electrode is suitable as a transparent electrode for transparent conductive substrates for various displays such as LCD where fine dimensional precision is required.

Figure 2:
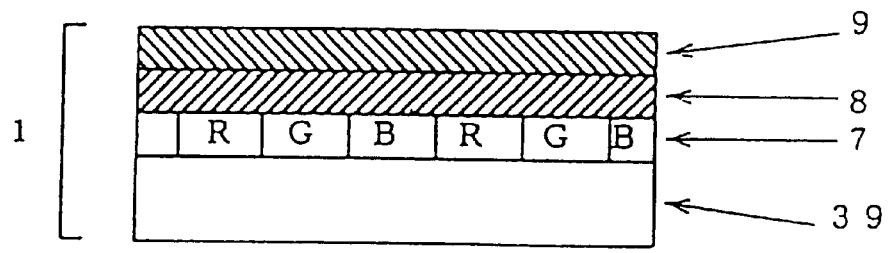
FIG. 2 is a cross-sectional diagrammatical view of a substrate for color LCD to be used in the present invention.

As a first patterning method, patterning may be carried out by forming a desired resist pattern on a transparent conductive film by a photolithography method as shown in FIG. 1, followed by etching by means of an acidic aqueous solution having a hydrogen ion concentration of from 0.01 to 9 M (mol/l). Within the above hydrogen ion concentration range, a concentration range is preferred within which the side etching amount is not more than 5 μm. With an acidic aqueous solution having a hydrogen ion concentration of less than 0.01 M, etching will not adequately proceed, and with an acidic aqueous solution having a hydrogen ion concentration of more than 9 M, the etching rate tends to be high, whereby the control will be difficult, and the side etching amount tends to exceed 5 μm.

The acidic aqueous solution may, for example, be an aqueous solution containing hydrochloric acid, hydrobromic acid, hydriodic acid, nitric acid, sulfuric acid or ferric chloride as the main component. Particularly preferred is an acidic aqueous solution containing hydrochloric acid or hydrobromic acid as the main component, since the etching rate is high, and the side etching is little.

Further, for the reason that etching of the Ag layer can be carried out efficiently, it is preferred to add an oxidizing agent having an oxidation-reduction potential more noble than Ag (i.e. having an oxidizing action against Ag) to the above described acid aqueous solution. By the addition of the oxidizing agent, the dissolution rate of Ag can be increased, whereby a better patterning property can be obtained. Further, the addition of the oxidizing agent is effective also from the viewpoint that it efficiently dissolves indium oxide.

The oxidizing agent may, for example, be nitrous acid, hydrogen peroxide, potassium permanganate, potassium iodate, ammonium ceric nitrate or ferric chloride. Particularly preferred is ferric chloride.

In this case, it is preferred to add the oxidizing agent to the acidic aqueous solution to bring the hydrogen ion concentration to from 0.01 to 9 M and the oxidizing agent concentration to from 0.0001 to 1.5 M. If the respective concentrations are outside these ranges, etching of the Ag layer tends to hardly proceed, an etching residue is likely to form, or the side etching amount is likely to exceed 5 μm. Otherwise, the etching rate tends to be so high that the control will be difficult.

Particularly preferred is an acidic aqueous solution containing ferric chloride and hydrochloric acid, or ferric chloride and hydrobromic acid, as the main components, for the reason that a readily controllable etching rate can be obtained, and the side etching will be little.

Specifically, for the reason that a very good patterning property with a side etching amount of from 2 25 to 4 μm, can be obtained, preferred is a combination of ferric chloride being from 0.01 to 1.5 M and hydrochloric acid being from 0.1 to 5 M as a hydrogen ion concentration, or a combination of ferric chloride being from 0.0005 to 0.5 M and hydrobromic acid being from 3 to 9 M as a hydrogen ion concentration.

Depending upon the respective film constructions, the concentrations of the acid and the oxidizing agent are preferably optimized for use. However, when zinc oxide-rich oxide is used for the oxide layer as shown in Examples 4, 6 and 19, good patterning can be carried out only with the acid. on the other hand, in the case of pattering a film made of indium oxide-rich oxide which is hardly soluble only with the acid, it is preferred to add the oxidizing agent within the above described range also from the reason that indium oxide is thereby readily soluble.

In the present invention, it is preferred that etching is carried out by means of an acidic aqueous solution containing halogen ions, as the acidic aqueous solution, followed by dipping in an aqueous solution of an alkali metal halide or in an aqueous solution of sodium thiosulfate. By such treatment, the etching residue 25 as shown in FIG. 7 can effectively be removed.

This may be explained as follows: When the etching residue such as a reaction product formed during the etching, is dipped in a solution wherein excess halogen ions are present, the dissolution equilibrium will be broken so that the etching residue will readily be dissolved in the aqueous solution of the alkali metal halide. Further, it is considered that when immersed in the aqueous solution of sodium thiosulfate, the etching residue such as a silver halide will readily be dissolved.

The acidic aqueous solution containing halogen ions may, for example, be an aqueous solution of HCl, HBr, HI or ferric chloride, and the alkali metal halide may, for example, be NaCl, KCl or NaBr.

The concentration of the alkali metal halide is preferably at least 0.5 M with a view to certainly removing the etching residue. Likewise, the concentration of sodium thiosulfate is preferably from 0.1 to 3 M.

Figure 8:
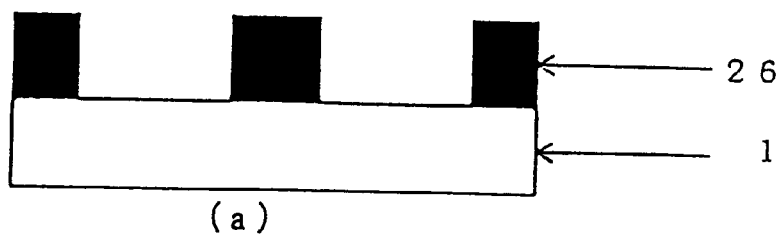
FIG. 8 is a diagrammatical view illustrating the patterning method of the present invention.
Figure 8:
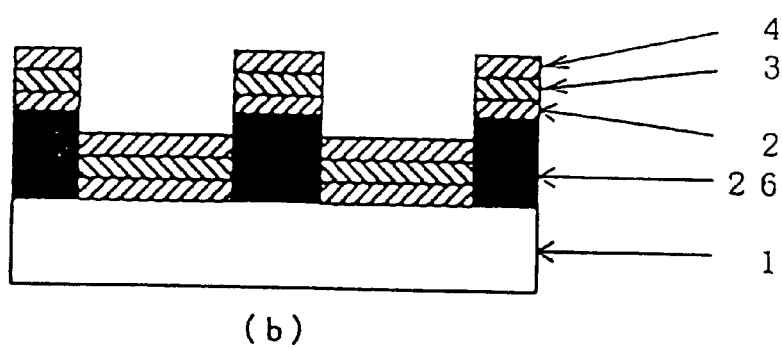
Figure 8:
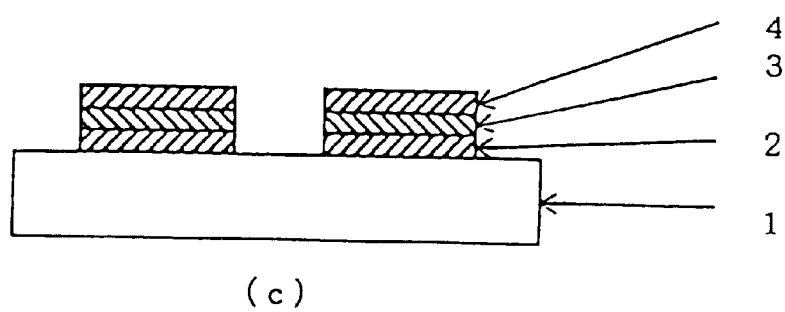

As a second patterning method in the present invention, a method as shown in FIG. 8 may be mentioned wherein a desired pattern is formed on a substrate by means of a resist soluble in an alkali solution or an organic solvent, then, the above-mentioned transparent conductive film is formed, and thereafter, unnecessary portions of the transparent conductive film are peeled (lifted off) together with the resist by means of an alkali solution or organic solvent.

The resist 26 soluble in an alkali solution or an organic solvent may, for example, be one having a novolak resin containing a photosensitive material dissolved in an organic solvent such as ethylene glycol monoethyl ether monoacetate.

The alkali solution as the peeling liquid may, for example, be an aqueous alkali solution containing from 0.5 to 3 wt % of NaOH in the solution, an aqueous alkali solution containing from 2 to 3 wt % of ammonium tetramethyl hydroxide in the solution, or an organic alkali solution comprising o-dichlorobenzene, phenol and an alkylbenzenesulfonic acid.

The organic solvent as the peeling liquid may, for example, be an organic solvent such as isopropanol, dimethylsulfoxide, ethylene glycol or trichloroethylene.

The resist or the peeling liquid is not particularly limited, so long as it gives no damage to the transparent conductive film or to the substrate.

As the method for forming a transparent conductive film after forming the resist pattern, it is preferred to carry out the film forming at a substrate temperature of at most 150° C. in order to avoid a thermal damage to the resist.

As characteristics of the above-mentioned first patterning method, it may be mentioned that an optional electrode pattern can be formed after the film forming, and there will be no deterioration in the film property due to degassing from the resist during the film forming.

On the other hand, the second patterning method has characteristics such that the cumbersome optimization of the etching liquid composition or the etching conditions is not required, an etching residue such as the reaction product with an acid is little, and a high patterning precision and a good pattern profile are obtainable.

Figure 9:
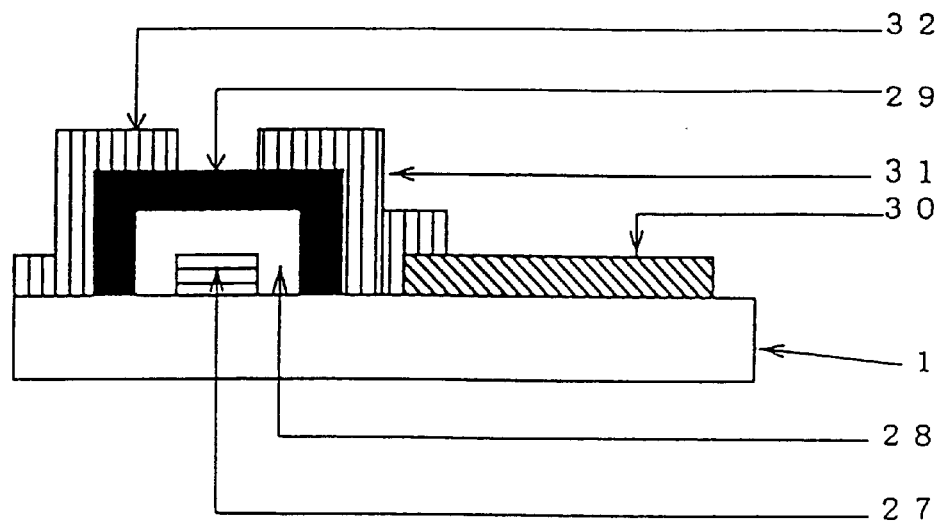
FIG. 9(a) is a diagrammatical view of a conventional electrode arrangement for TFT type LCD.
FIG. 9(b) is a diagrammatical view of an electrode arrangement for TFT type LCD according to an embodiment of the present invention.
Figure 9:
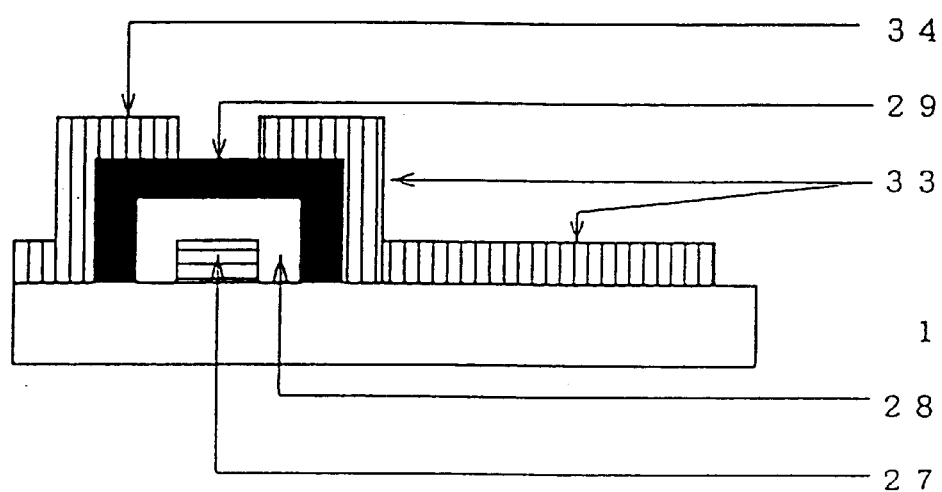

The transparent conductive film and the process for forming the transparent electrode of the present invention can be applied to a thin film transistor (TFT) type LCD as shown in FIG. 9. In FIG. 9, reference numeral 27 indicates a gate electrode, numeral 28 a gate insulating film, numeral 29 a semiconductor layer, numeral 30 a pixel electrode, numeral 31 a drain electrode, numeral 32 a source electrode, numeral 33 a pixel electrode-integrated drain electrode, and numeral 34 a source electrode.

The present invention provides a substrate provided with an electrode arrangement for LCD, wherein a source electrode, a drain electrode and a pixel electrode for a TFT type LCD are formed by the above described transparent conductive film.

The present invention provides also a process for forming a substrate provided with an electrode arrangement for LCD, which comprises forming a gate electrode, a gate-insulating film and a semiconductor layer on a substrate, followed by forming the abovementioned transparent conductive film, and then subjecting the transparent conductive film to etching processing to form a drain electrode having a pixel electrode integrated, and a source electrode.

By using the above described transparent conductive film as the source electrode 32, the drain electrode 31 and the pixel electrode 30, one batch film-forming and one batch patterning of the source, drain and pixel electrodes, are made possible, which provides excellent effects for improvement of the productivity and reduction of defects.

A transparent conductive film having the construction as identified in any one of Examples 1 to 18 (Examples of the present invention) and Examples 19 and 20 (Comparative Examples) in Tables 1 and 2, was formed by direct current sputtering on a substrate 1 comprising a glass base plate 39, and a color filter layer 7, an acrylic transparent resin protective layer 8 for the protection and planarization of the color filter and an inorganic interlayer 9 made of a silica film, preliminarily formed thereon, as shown in FIG. 2.

To form the film containing $In_2O_3$ as the main component, film-forming was carried out in an atmosphere of 3 mTorr of Ar gas containing 3 vol % of oxygen using a sintered target of $In_2O_3$ containing 10 atomic % of Sn based on the sum of In and Sn ("$In_2O_3$ containing 10 atomic % of Sn" will be hereinafter referred to as "ITO"). The composition of the obtained ITO film was substantially the same as the composition of the target.

To form the film containing ZnO as the main component, film-forming was carried out in an atmosphere of 3 mTorr of Ar gas using a sintered target of ZnO containing 5 atomic % of Ga ("ZnO containing 5 atomic % of Ga" will be hereinafter referred to as "GZO"). The composition of the obtained GZO film was substantially the same as the composition of the target.

In a case where the oxide layer was made to have a multi-layered structure, ITO layers and GZO layers were alternately laminated, so that a GZO layer was disposed at the portion which was in contact with the Ag layer, and an ITO layer was disposed at the uppermost portion of the uppermost oxide layer.

To form a mixed oxide, film-forming was carried out in an atmosphere of 3 mTorr of Ar gas containing 3 vol % of oxygen using a sintered target of a mixed oxide so that the atomic ratio of In to Zn would be 4:6 (identified as mix 1 in the Tables), 8:2 (identified as mix 2 in the Tables) or 9:1 (identified as mix 3 in the Tables). The composition of each obtained film was substantially the same as the composition of each target. Further, in the Tables, in multilayer 1, the thickness of ITO was about 3 nm, and the thickness of GZO was about 7 nm, and in multilayer 2, the thickness of ITO was about 7 nm and the thickness of GZO was about 3 nm. In both multilayer 1 and multilayer 2, ITO and GZO were alternately laminated so that the construction would be substrate/ITO/GZO/ . . . ITO/GZO/metal layer between a substrate and metal layer, b) metal layer/GZO/ITO/ . . . ITO/GZO/metal layer between a metal layer and a metal layer, and c) metal layer/GZO/ITO . . . GZO/ITO on the outermost metal layer.

The metal layer was formed by film-forming in an atmosphere of 3 mTorr of Ar gas using a various target, such as Pd, Au, Ag, a Ag alloy containing 1 atomic % of Pd (1% PdAg) or a Ag alloy containing 1 atomic % of Au (1% AuAg). The thicknesses of the respective films were adjusted by the sputtering electrical power and the film forming time. In the Tables, Pd-rich layer and Ag-rich layer were prepared by sputtering a Pd target and a Ag target simultaneously, wherein the sputtering electrical powers for the respective targets were changed so that the compositional ratio of Pd became high (at least 50%) at the interface with the oxide layer, and the compositional ratio of Ag became high (at least 50%) at the center of the thickness direction of the metal film, and so that the thickness of the Pd-rich layer became about 1 nm.

Further, a case wherein heat treatment at 250° C. for 30 minutes was carried out in the atmosphere after the film forming, was identified as heat treatment "Yes", and a case where no such heat treatment was carried out, was identified by "No" in the Tables. Further, numerals in the brackets in the Tables indicate the film thicknesses (nm).

With respect to samples shown in Examples 1 to 20 in Tables 1 and 2, 1) the electrical resistance, 2) the visible light transmittance, 3) the patterning property, 4) the moisture resistance and 5) the alkali resistance were evaluated. The methods for evaluating 3) the patterning property, 4) the moisture resistance and 5) the alkali resistance, are shown in Table 3.

The patterning was carried out with the following etching liquid after coating a resist on a transparent conductive film as identified in Table 1 or 2 and forming a stripe-shaped resist pattern with a line width of 130 μm and a space width of 20 μm by a photolithography method. Namely, in Examples 4, 6 and 19, an etching liquid of ferric chloride was used which served as both the acidic aqueous solution and the oxidizing agent, and etching was carried out after determining the optimum concentration within a hydrogen ion concentration of from 0.01 to 6 M. In other Examples, an etching liquid comprising hydrochloric acid (an acidic aqueous solution) and ferric chloride (an oxidizing agent) was used, and etching was carried out after determining the optimum compositional concentrations within the ranges of a hydrogen ion concentration of from 0.1 to 5 M and an oxidizing agent concentration of from 0.01 to 1.5 M. The results were as shown in Tables 1 and 2.

Then, in order to examine the effective compositional range of the etching liquid in detail, the transparent conductive films were subjected to patterning by means of etching liquids having various compositions. Namely, on the transparent conductive films of Example 1, resist patterns were formed in the same manner as described above, and then the patterning properties were evaluated by using etching liquids having various compositions as shown in Table 4. The results were as shown in Table 4. Similar evaluation of patterning properties by means of etching liquids having various compositions was carried out also with respect to Examples 2 to 18, whereby the same results as in Example 1 were obtained. Further, with respect to Example 4, evaluation was carried out by means of etching liquids having various concentrations as identified in Table 5. The results were as shown in Table 5. Similar evaluation of the patterning properties by means of etching liquids having various compositions was carried out also with respect to Examples 6 and 19, whereby the same results as in Example 4 were obtained. On the other hand, with respect to Example 20, patterning was attempted with etching liquids having various compositions as identified in Tables 4 and 5, but in each case, good patterning properties were not obtained.

The concentration in Table 5 indicates the hydrogen ion concentration. Further, in Tables 4 and 5, symbol ⊙ means that the side etching amount was not more than 4 μm, symbol ○ means that the side etching amount exceeded 4 μm but was not more than 5 μm, and symbol X means that the side etching amount exceeded 5 μm.

As shown in Tables 4 and 5, in a region where the concentration of the etchant composition is lower than the optimum acid concentration, the etching rate lowers, and the side etching amount increases. In a region where the concentration is higher than the optimum acid concentration, the etching rate becomes higher than necessary, and the side etching amount also increases. With respect to the oxidizing agent, in a region where the concentration is lower than the optimum oxidizing agent concentration, dissolution of the Ag layer tended to hardly proceed, and the side etching amount tended to increase, and also in a region where the concentration is higher than the optimum oxidizing agent concentration, the side etching amount tended to increase.

Especially when the effect for removing the etching residue was compared as between one which was dipped in a 5 M aqueous solution of an alkali metal halide after etching by means of an acidic aqueous solution containing ferric chloride and one which was not so dipped, good results were obtained with one which was dipped in the aqueous solution of an alkali metal halide. Further, good results were obtained also in a case where after the etching in the same manner, the product was dipped in a 1 M aqueous solution of sodium thiosulfate instead of the above-mentioned aqueous solution of an alkali metal halide.

Various properties of the transparent conductive films of the present invention are shown in Tables 1 and 2. With the three-layer film structures of the transparent oxide and the Ag layer as shown in Examples 1 to 14 and Examples 19 and 20, transparent conductive films having a resistance of from 3 to 4Ω/□ and a visible light transmittance of from 74 to 76%, and with the five-layer film structures as shown in Examples 15 to 18, transparent conductive films having a resistance of about 2 Ω/□ and a visible light transmittance of about 73%, were obtained. Further, also by heat treatment after the film forming, it was possible to improve the visible light transmittance and to reduce the resistance.

In the cases where the transparent conductive films shown in Examples 1 to 19, were employed, good patterning properties were obtained, whereby the pattern edge shape was sharp, no substantial etching residue was observed, and the side etching amount was at a level of from 2 to 4 μm. Also with respect to the moisture resistance, no formation of calescence points (defects) with a diameter of at least 0.5 mm was observed, and excellent performance was obtained.

The alkali resistance of the structure wherein an oxide film containing no $In_2O_3$ was used, as shown in Example 19, was not necessarily adequate.

The alkali resistance is improved as the blend ratio of $In_2O_3$ to ZnO increases, and as the ratio of the thickness of the ITO layer to the GZO layer increases. However, if the component ratio of $In_2O_3$ exceeds 98 atomic %, or if the ratio of the thickness of the ITO layer exceeds 95%, the patterning properties and the moisture resistance tend to deteriorate.

As shown in Examples 7, 8, 14, 16, 17 and 18, an attack of alkali from the film surface can effectively be prevented by making the uppermost portion of the uppermost oxide layer to be a layer containing a large amount of the $In_2O_3$ component. However, if the layer thickness exceeds 50 nm, the patterning properties tend to deteriorate.

As shown in Examples 11 to 15, it is possible to improve the visible light transmittance and to reduce the resistance by making the metal layer to have a multilayer structure or a structure having a compositional gradient.

On the other hand, with the film having a structure wherein a film containing Ag was sandwiched by ITO films as shown in Example 20, the alkali resistance was excellent, but peeling was substantial at the interfaces between the metal film and the ITO films, a desired electrode pattern was not obtained, and also in the moisture resistance test, many calescence points (defects) with a diameter of at least 1 mm were formed, and good results were not obtained.

Next, as the second patterning method, a photoresist made of a novolak type resin was coated on a substrate 1 having a color filter layer 7, an acrylic transparent resin protective layer 8 for the protection and planarization of the color filter and an inorganic interlayer 9 made of silica, preliminarily formed on a glass substrate 39, and by a usual photolithography method, a stripe pattern 26 was formed with a line width of 130 $\mu$m and a space width of 20 $\mu$m (FIG. 8(a)), and then a transparent conductive film having a structure as shown in Examples 1 to 18, was formed by direct current sputtering. No heating of the substrate was carried out (FIG. 8(b)). Thereafter, while applying supersonic wave vibration, unnecessary portions of the transparent conductive film were peeled together with the resist by means of an aqueous solution of NaOH, to form a desired electrode pattern (FIG. 8(c)).

As a result, in each case, no residue of the transparent conductive film was observed at the space portion, the edge shape was very sharp, and yet, the dimensional precision of the pattern width was good at a level of from 1 to 2 $\mu$m.

Further, on a glass substrate, a transparent conductive film having a structure as shown in Examples 1 to 18 was formed by direct current sputtering without heating the substrate. With respect to some of the films thus prepared, heat treatment at 250° C. for 30 minutes in the atmosphere was carried out after the film forming. Then, a resist was coated, and a resist pattern simulating a source 34, a drain 33 and a pixel electrode ($InSn_xO_y$) 33 for TFT type LCD, as shown in FIG. 9(b), was formed.

Figure 10:
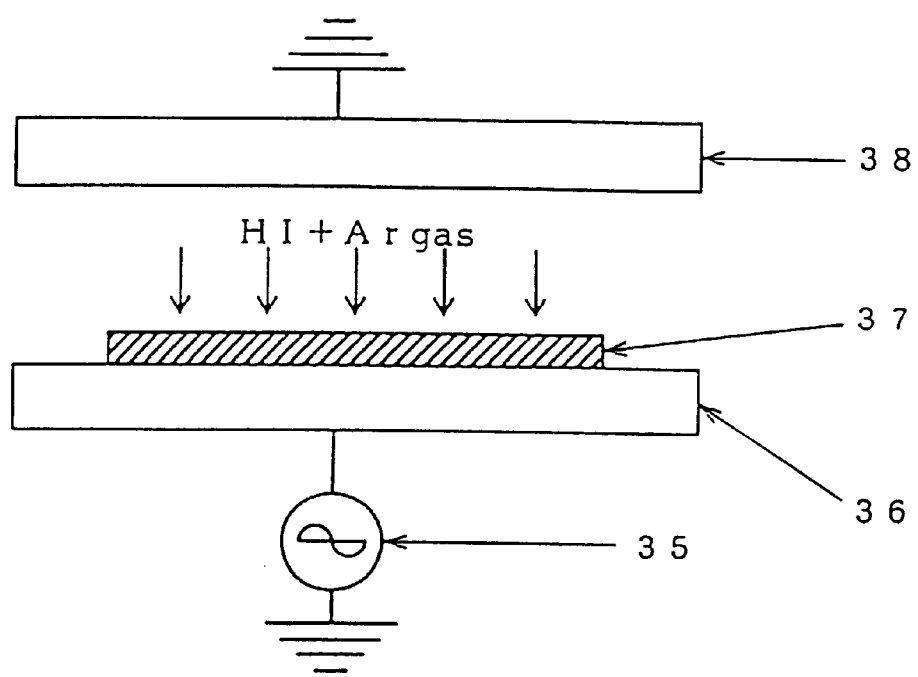
FIG. 10 is a diagrammatical view of a dry etching apparatus used in Examples.

Further, using a dry etching apparatus as shown in FIG. 10, formation of an electrode pattern was attempted by using HI (hydrogen iodide) and Ar gas. As a result, the pattern edge shape was sharp, no etching residue or the like was observed, and the side etching amount was at a level of from 1 to 2 $\mu$m. Thus, the results obtained were satisfactory as the source, drain and pixel electrodes for TFT type LCD. In FIG. 10, reference numeral 35 indicates a RF power source, numeral 36 a cathode electrode, numeral 37 a sample, and numeral 38 an anode electrode.

According to the present invention, a low resistivity with a sheet resistance of not higher than 3 $\Omega$/□ can be readily realized with a total film thickness of the transparent conductive film being not more than 300 nm, and yet it is possible to present a transparent conductive film excellent in durability such as alkali resistance and moisture resistance.

Further, according to the process for forming an electrode of the present invention, processing of an electrode can be carried out inexpensively with a high resolution.

The transparent conductive film of the present invention can be formed not only on glass, but also on a plastic having a low film-forming temperature (not higher than 100° C.) or on a substrate provided with a color filter for color LCD (not higher than 250° C.), and it is therefore most suitable as a transparent electrode film for an electron display which requires low resistance, such as LCD, an electroluminescence display, a plasma display or an electrochromic element and can be presented at a low cost as compared with the conventional product. Especially in a simple matrix type LCD, it provides excellent effects for enlarging the display area or for improving the display quality such as reduction of cross talk.

Further, also in TFT type LCD, it can be used as a source electrode, a drain electrode and a pixel electrode, whereby batch film-forming and batch patterning for the source, drain and pixel electrodes, will be possible, thus providing excellent effects for improving the productivity or for reducing the effects.

TABLE 1

| Layer Structure | | | | | | |
|---|---|---|---|---|---|---|
| Mix 1: A mixed oxide layer of In and Zn in an atomic ratio of 4:6. | | | | | | |
| Mix 2: A mixed oxide layer of In and Zn in an atomic ratio of 8:2. | | | | | | |
| Mix 3: A mixed oxide layer of In and Zn in an atomic ratio of 9:1. | | | | | Moisture Resistance | |
| Multilayer 1: A multilayer structure comprising ITO (7 nm) and GZO (7 nm). | | | Visible | | 40° C., | |
| Multilayer 2: A multilayer structure comprising ITO (7 nm) and GZO (3 nm). | Heat treatment | Resistance $\Omega$/* | light trans- mittance % | Patterning | 90% RH, 1 week | Alkali resistance |
| Example 1 Substrate/mix 2/1% PdAg/mix 2 (16)/(11)/(38) | No | 3.6 | 74.3 | ○ | ○ | B |
| Example 2 Substrate/multilayer 2/1% PdAg/multilayer 2 (16)/(11)/(38) | No | 3.5 | 74.5 | ○ | ○ | B |
| Example 3 Substrate/mix 2/1% PdAg/mix 2 *16)/(11)/(38) | Yes | 3.0 | 75.4 | ○ | ○ | B |
| Example 4 Substrate/mix 2/1% PdAg/mix 1 (16)/(11)/(38) | Yes | 3.1 | 75.3 | ○ | ○ | C |

TABLE 1-continued

Layer Structure
Mix 1: A mixed oxide layer of In and Zn in an atomic ratio of 4:6.
Mix 2: A mixed oxide layer of In and Zn in an atomic ratio of 8:2.
Mix 3: A mixed oxide layer of In and Zn in an atomic ratio of 9:1.
Multilayer 1: A multilayer structure comprising ITO (7 nm) and GZO (7 nm).
Multilayer 2: A multilayer structure comprising ITO (7 nm) and GZO (3 nm).

|  | | Heat treatment | Resistance Ω/* | Visible light transmittance % | Patterning | Moisture Resistance 40° C., 90% RH, 1 week | Alkali resistance |
|---|---|---|---|---|---|---|---|
| Example 5 | Substrate/multilayer 2/1% PdAg/multilayer 2 (16)/(11)/(38) | Yes | 2.9 | 75.2 | ○ | ○ | B |
| Example 6 | Substrate/multilayer 1/1% PdAg/multilayer 1 (16)/(11)/(38) | Yes | 3.0 | 75.2 | ○ | ○ | C |
| Example 7 | Substrate/mix 2/1% PdAg/mix 2/mix 3 (16)/(11)/(18)/(20) | Yes | 3.1 | 75.3 | ○ | ○ | A |
| Example 8 | Substrate/multilayer 2/1% PdAg/multilayer 2/ITO (16)/(11)/(18)/(20) | Yes | 3.0 | 75.1 | ○ | ○ | A |
| Example 9 | Substrate/mix 3/mix 2/1% PdAg/mix 2 (6)/(10)/(11)/(38) | Yes | 3.1 | 75.3 | ○ | ○ | B |

TABLE 2

| Example 10 | Substrate/ITO/multilayer 2/1% PdAg/multilayer 2 (6)/(10)/(11)/(38) | Yes | 3.1 | 75.2 | ○ | ○ | B |
|---|---|---|---|---|---|---|---|
| Example 11 | Substrate/mix 2/Pd/Ag/Pd/mix 2 (16)/(0.5)/(10)/(0.5)/(38) | Yes | 2.8 | 75.7 | ○ | ○ | B |
| Example 12 | Substrate/mix 2/Pd/Ag/Pd/Ag/Pd/mix 2 (16)/(0.5)/(5)/(0.5)/(5)/(0.5)/(38) | Yes | 2.9 | 75.6 | ○ | ○ | B |
| Example 13 | Substrate/mix 2/Au/Ag/Au/Ag/Au/mix 2 (16)/(0.5)/(5)/(0.5)/(5)/(0.5)/(38) | Yes | 2.7 | 75.8 | ○ | ○ | B |
| Example 14 | Substrate/mix 2/Pd-rich/Ag-rich/Pd-rich/mix 2/mix 3 (40)/(1)/(9)/(1)/(20)/(20) Pd-rich: A layer containing at least 50% of Pd, Ag-rich: A layer containing at least 50% of Ag | Yes | 2.9 | 75.5 | ○ | ○ | A |
| Example 15 | Substrate/mix 2/Pd/Ag/Pd/Mix 2/Pd/Ag/Pd/mix 2 (40)/(0.5)/(10)/(0.5)/(90)/(0.5)/(10)/(0.5)/(40) | Yes | 1.9 | 73.8 | ○ | ○ | B |
| Example 16 | Substrate/mix 2/1% PdAg/mix 2/1% PdAg/mix 2/ITO (40)/(11)/(90)/(11)/(20)/(20) | Yes | 2.1 | 73.3 | ○ | ○ | A |
| Example 17 | Substrate/mix 2/1% AuAg/mix 2/1% AuAg/mix 2/mix 3 (40)/(11)/(90)/(11)/(20)/(20) | Yes | 1.9 | 74.0 | ○ | ○ | A |
| Example 18 | Substrate/multilayer 2/1% PdAg/multilayer 2/1% PdAg/multilayer 2/ITO (40)/(11)/(90)/(11)/(40)/(20) | Yes | 2.0 | 73.5 | ○ | ○ | A |
| Example 19 | Substrate/GZO/1% PdAg/GZO (16)/(11)/(38) | Yes | 3.0 | 75.4 | ○ | ○ | B |
| Example 20 | Substrate/ITO/1% PdAg/ITO (16)/(11)/(38) | Yes | 3.6 | 76.0 | X | X | A |

TABLE 3

| Evaluation of alkali resistance | 1 wt % NaOH room temperature 10 min | 1 wt % NaOH room temperature 20 min | 3 wt % NaOH room temperature, 20 min | 3 wt % NaOH 60° C., 20 min |
|---|---|---|---|---|
| A | OK | OK | OK | OK |
| B | OK | OK | OK | NG |
| C | OK | OK | NG | NG |
| D | OK | NG | NG | NG |

Evaluation of patterning property                Evaluation of moisture resistance ○: Side etching amount of from 2 to 4 μm, good pattern shape, no residue
X: Side etching amount of at least 10 μm, pattern peeling observed                X: Defects of at least 1 mm observed

TABLE 4

| Acid | Hydrochloric acid (at room temperature) | | | | |
|---|---|---|---|---|---|
| Oxidizing agent | Less than 0.01 M | 0.01 to 0.1 M | 0.1 to 5 M | 5 to 6 M | More than 6 M |
| Ferric chloride | | | | | |
| Less than 0.0001 M | × Etching did not proceed | × Large side etching | × Large side etching | × Large side etching | × Large side etching |
| 0.0001 M to 0.01 M | × Etching did not proceed | ○ Very small amount of Ag residue observed. Slightly large side etching. | ○ Very small amount of Ag residue observed. Slightly large side etching. | ○ Very small amount of Ag residue observed. Slightly large side etching. | × Large side etching |
| 0.01 M to 1.5 M | × Etching did not proceed | ○ Slightly large side etching | ⊚ Excellent | ○ Slightly large side etching | × Large side etching |
| More than 1.5 M | × Etching did not proceed | × Large side etching | × Large side etching | × Large side etching | × Etching rate was so high that the control was difficult |

| Acid | Hydrochloric acid (at room temperature) | | | |
|---|---|---|---|---|
| Oxidizing agent | Less than 0.01 M | 0.01 to 3 M | 3 to 9 M | More than 9 M |
| Ferric chloride | | | | |
| Less than 0.0001 M | × Etching did not proceed | × Large side etching | × Large side etching | Industrial HBr was unavailable. |
| 0.001 M to 0.0005 M | × Etching did not proceed | ○ Very small amount of Ag residue observed. Slightly large side etching. | ○ Very small amount of Ag residue observed. Slightly large side etching. | |
| 0.005 M to 0.5 M | × Etching did not proceed | ○ Slightly large side etching | ⊚ Excellent | |
| More than 0.5 M | × Etching did not proceed | × Large side etching | × Large side etching | |

TABLE 5

| Ferric chloride (at room temperature) | | |
|---|---|---|
| Less than 0.01 M | 0.01 to 6 M | More than 6 M |
| × Etching did not proceed | ⊚ Excellent | × Etching rate was so high that the control was difficult |

Having described the present invention, it will be apparent to one of ordinary skill in the art that many changes and modifications may be made to the above-described embodiments without departing from the spirit and scope of the present invention.

What is claimed is:

1. A transparent conductive film, comprising a transparent oxide layer and a metal layer laminated in this order from a substrate side in a total of (2n +1) layers, wherein n is 2, wherein the transparent oxide layer comprises ZnO and further contains In within a range of from about 9 to 98 atomic % based on the sum of Zn and In, and wherein the metal layer is a metal layer containing Ag.

2. The transparent conductive film according to claim 1, wherein at least one of the transparent oxide layers is a layer made of a multi-layer film comprising film(s) containing $In_2O_3$ as the main component and film(s) containing ZnO as the main component.

3. The transparent conductive film according to claim 1, wherein the transparent oxide layer farthest from the substrate is a layer made of a multi-layer film comprising film(s) containing $In_2O_3$ as the main component and film(s) containing ZnO as the main component, said multi-layer film having layers laminated so that their In contents increase as they are located farther from the substrate.

4. The transparent conductive film according to claim 1, wherein the transparent oxide layer nearest to the substrate is a layer made of a multi-layer film comprising film(s) containing $In_2O_3$ as the main component and film(s) containing ZnO as the main component, said multi-layer film having films laminated so that their In contents increase as they are located nearer to the substrate.

5. The transparent conductive film according to claim 1, wherein at least one of the transparent oxide layers is a layer comprising a mixed oxide of $In_2O_3$ and ZnO.

6. The transparent conductive film according to claim 1, wherein the transparent oxide layer farthest from the substrate is a layer comprising a mixed oxide of $In_2O_3$ and ZnO, which has a compositional gradient so that the In content increases in the layer thickness direction in the direction away from the substrate.

7. The transparent conductive film according to claim 1, wherein the transparent oxide layer nearest to the substrate is a layer comprising a mixed oxide of $In_2O_3$ and ZnO, which has a compositional gradient so that the In content increases in the layer thickness direction in the direction towards the substrate.

8. The transparent conductive film according to claim 1, wherein at least one of the transparent oxide layers is a layer comprising a mixed oxide of $In_2O_3$ and ZnO, or a layer made of a multi-layer film comprising film(s) containing $In_2O_3$ as the main component and film(s) containing ZnO as the main component, and it is an oxide layer which contains Zn in an amount of at least 50 atomic % based on the sum of Zn and In at a portion where said transparent oxide layer is in contact with a metal layer containing Ag.

9. The transparent conductive film according to claim 1, wherein at least one of the transparent oxide layers is a layer made of a multi-layer film comprising film(s) containing $In_2O_3$ as the main component and film(s) containing ZnO as the main component, wherein the film(s) containing ZnO as the main component contain(s) Ga.

10. The transparent conductive film according to claim 1, wherein at least one of the metal layers is a layer made of an alloy film comprising Ag and other metal (s).

11. The transparent conductive film according to claim 1, wherein at least one of the metal layers is a layer made of a multi-layer film comprising metal layer(s) containing Ag and metal layer(s) containing other metal(s).

12. The transparent conductive film according to claim 1, wherein at least one of the metal layers is a layer which comprises Ag and other metal(s) and which has a compositional gradient so that the Ag concentration changes in the thickness direction of the layer.

13. The transparent conductive film according to claim 10, wherein said other metal(s) is Au, or Pd or both.

14. The transparent conductive film according to claim 11, wherein said other metal(s) is Au, or Pd or both.

15. The transparent conductive film according to claim 12, wherein said other metal(s) is Au, or Pd or both.

16. A process for forming a transparent electrode, which comprises forming a transparent conductive film as defined in claim 1 on a substrate, followed by patterning by etching by means of an acidic aqueous solution having a hydrogen ion concentration of from 0.01 to 9 M.

17. The process for forming a transparent electrode according to claim 16, wherein as the acidic aqueous solution, an acidic aqueous solution containing an oxidizing agent having an oxidizing action against Ag, is employed.

18. A substrate provided with an electrode arrangement for a liquid crystal display, wherein a source electrode, a drain electrode and a pixel electrode for a thin film transistor type liquid crystal display are formed by a transparent conductive film as defined in claim 1.

19. A process for forming a substrate provided with an electrode arrangement for a liquid crystal display, which comprises forming a gate electrode, a gate-insulating film and a semiconductor layer on a substrate, followed by forming a transparent conductive film as defined in claim 1, and then subjecting the transparent conductive film to etching processing to form a drain electrode having a pixel electrode integrated, and a source electrode.

20. The transparent conductive film according to claim 1, wherein the content of In is from 45 to 95 atomic %.

21. The transparent conductive film according to claim 1, wherein each of said transparent oxide layers has a thickness of from 10 to 200 nm.

22. The transparent conductive film according to claim 21, wherein each of said transparent oxide layers has a thickness of from 20 to 50 nm.

23. The transparent conductive film according to claim 1, wherein each of the transparent oxide layers comprises Zn in an amount of at least 50 atomic % based on the sum of Zn and In.

24. The transparent conductive film according to claim 1, wherein each of the metal layers has a thickness of from 8 to 20 nm.

25. The transparent conductive film according to claim 24, wherein each of the metal layers has a thickness of from 10 to 15 nm.

26. The transparent conductive film according to claim 13, wherein said other metal is Pd, wherein the proportion of Pd in the Pd Ag layer is from 0.1 to 5.0 atomic %, based on the sum of Ag and Pd.

* * * * *